(12) United States Patent
Marchena et al.

(10) Patent No.: US 9,324,682 B2
(45) Date of Patent: Apr. 26, 2016

(54) METHOD AND SYSTEM FOR HEIGHT REGISTRATION DURING CHIP BONDING

(71) Applicant: Skorpios Technologies, Inc., Albuquerque, NM (US)

(72) Inventors: Elton Marchena, Albuquerque, NM (US); John Y. Spann, Albuquerque, NM (US); Timothy Creazzo, Albuquerque, NM (US); Stephen B. Krasulick, Albuquerque, NM (US); Amit Mizrahi, Albuquerque, NM (US)

(73) Assignee: Skorpios Technologies, Inc., Albuquerque, NM (US)

( * ) Notice: Subject to any disclaimer, the term of this patent is extended or adjusted under 35 U.S.C. 154(b) by 0 days.

(21) Appl. No.: 14/262,529

(22) Filed: Apr. 25, 2014

(65) Prior Publication Data

US 2014/0319656 A1    Oct. 30, 2014

Related U.S. Application Data

(60) Provisional application No. 61/815,938, filed on Apr. 25, 2013.

(51) Int. Cl.
| | |
|---|---|
| *H01L 21/00* | (2006.01) |
| *H01L 29/12* | (2006.01) |
| *H01L 33/00* | (2010.01) |
| *H01L 27/15* | (2006.01) |
| *H01L 23/00* | (2006.01) |
| *G02B 6/42* | (2006.01) |
| *H01L 23/13* | (2006.01) |

(52) U.S. Cl.
CPC ............... *H01L 24/83* (2013.01); *G02B 6/423* (2013.01); *H01L 23/13* (2013.01); *G02B 6/4238* (2013.01); *H01L 24/29* (2013.01); *H01L 24/32* (2013.01); *H01L 2224/29036* (2013.01); *H01L 2224/29109* (2013.01); *H01L 2224/8314* (2013.01); *H01L 2224/83193* (2013.01); *H01L 2224/83345* (2013.01); *H01L 2924/12042* (2013.01)

(58) Field of Classification Search
CPC ...... G02B 6/423; G02B 6/4231; G02B 6/136; H01L 24/11
USPC ............ 438/26, 27, 29, 69, 106; 385/14, 129, 385/130
See application file for complete search history.

(56) References Cited

U.S. PATENT DOCUMENTS

| | | | |
|---|---|---|---|
| 6,888,989 B1 | 5/2005 | Zhou et al. | |
| 7,326,611 B2 | 2/2008 | Forbes | |
| 7,531,395 B2 | 5/2009 | Blomiley et al. | |
| 7,939,934 B2 | 5/2011 | Haba et al. | |

(Continued)

OTHER PUBLICATIONS

U.S. Appl. No. 62/012,814, filed Jun. 16, 2014, Damien Lambert, all pages.

(Continued)

*Primary Examiner* — Hsien Ming Lee
(74) *Attorney, Agent, or Firm* — Kilpatrick Townsend & Stockton LLP

(57) ABSTRACT

A method of fabricating a composite semiconductor structure is provided. Pedestals are formed in a recess of a first substrate. A second substrate is then placed within the recess in contact with the pedestals. The pedestals have a predetermined height so that a device layer within the second substrate aligns with a waveguide of the first substrate, where the waveguide extends from an inner wall of the recess.

16 Claims, 8 Drawing Sheets

(56) References Cited

U.S. PATENT DOCUMENTS

| | | |
|---|---|---|
| 2001/0010743 A1 | 8/2001 | Cayrefourcq et al. |
| 2004/0077135 A1 | 4/2004 | Fan et al. |
| 2004/0182914 A1 | 9/2004 | Venugopalan |
| 2004/0245425 A1 | 12/2004 | Delpiano et al. |
| 2005/0082552 A1 | 4/2005 | Fang et al. |
| 2006/0002443 A1 | 1/2006 | Farber et al. |
| 2006/0093002 A1 | 5/2006 | Park et al. |
| 2006/0104322 A1 | 5/2006 | Park et al. |
| 2010/0111128 A1 | 5/2010 | Qin et al. |
| 2010/0123145 A1* | 5/2010 | Lee ................................. 257/89 |
| 2011/0085760 A1* | 4/2011 | Han et al. ........................ 385/14 |
| 2011/0216997 A1 | 9/2011 | Gothoskar et al. |
| 2012/0002931 A1 | 1/2012 | Watanabe |
| 2013/0051727 A1 | 2/2013 | Mizrahi et al. |
| 2013/0301975 A1 | 11/2013 | Spann et al. |

OTHER PUBLICATIONS

International Search Report and Written Opinion of PCT/US2014/035563 mailed on Aug. 27, 2014, 15 pages.

U.S. Appl. No. 14/509,979, filed Oct. 8, 2014, Stephen Krasulick, et al., all pages.

ISR/WO mailed on Jan. 22, 2015 for International Patent Application No. PCT/US2014/059900 filed on Oct. 9, 2014, all pages.

\* cited by examiner

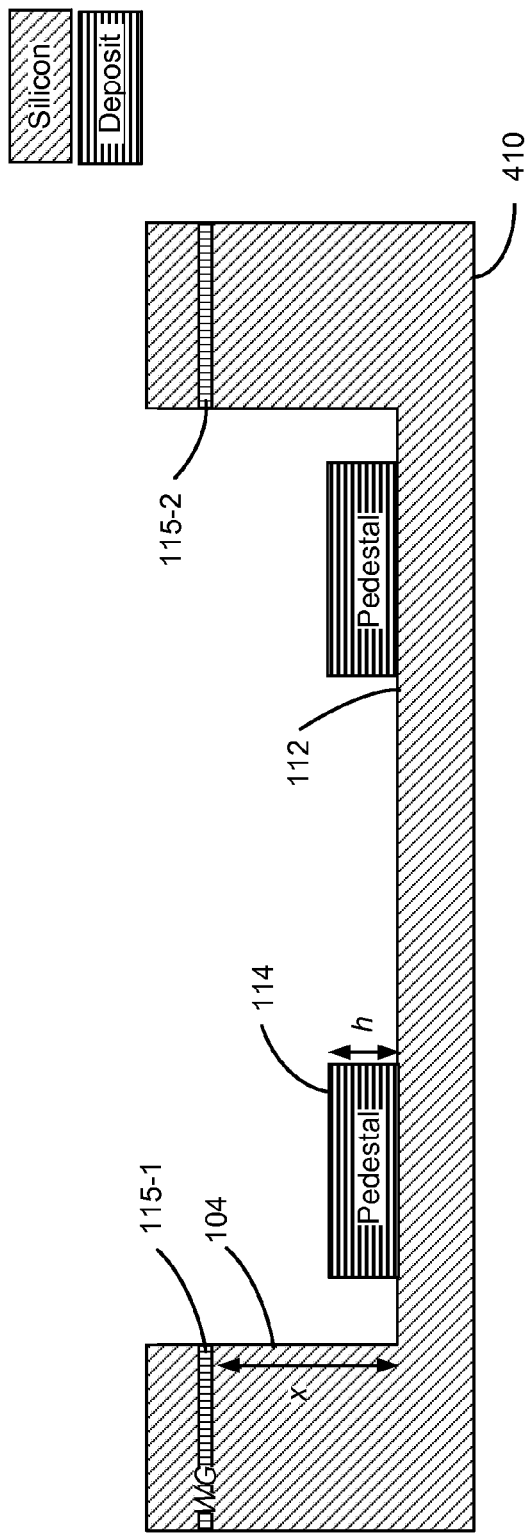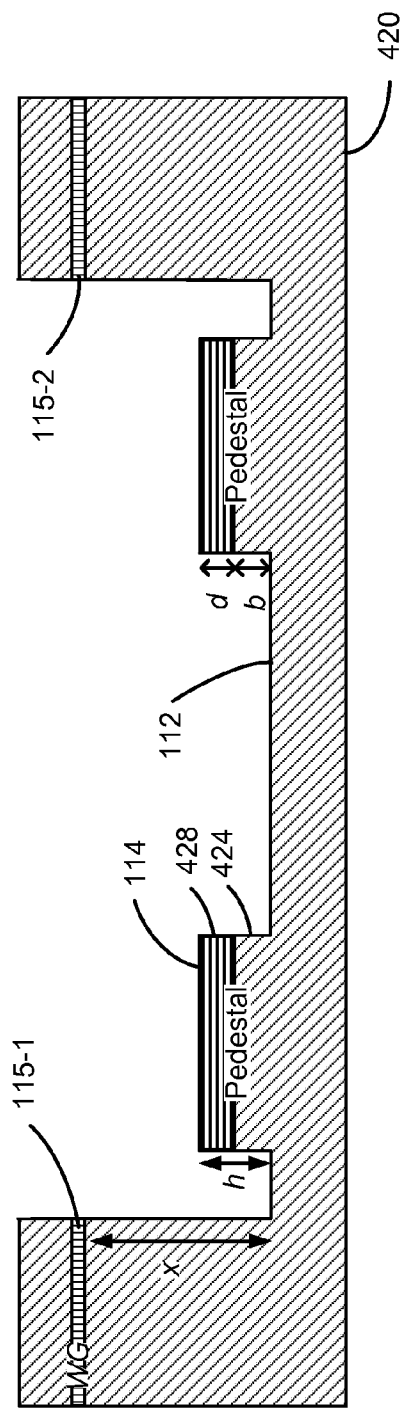
FIG. 4A
FIG. 4B

METHOD AND SYSTEM FOR HEIGHT REGISTRATION DURING CHIP BONDING

CROSS-REFERENCES TO RELATED APPLICATIONS

This application claims priority to U.S. Provisional Patent Application No. 61/815,938, filed on Apr. 25, 2013, which is incorporated by reference in its entirety for all purposes.

BACKGROUND OF THE INVENTION

Silicon integrated circuits ("ICs") have dominated the development of electronics and many technologies based upon silicon processing have been developed over the years. Their continued refinement led to nanoscale feature sizes that can be important for making metal oxide semiconductor CMOS circuits. On the other hand, silicon is not a direct bandgap material. Although direct bandgap materials, including III-V compound semiconductor materials, have been developed, there is a need in the art for improved methods and systems related to photonic ICs utilizing silicon substrates.

BRIEF SUMMARY OF THE INVENTION

Embodiments of the present invention provide accurate z-height alignment between a first substrate (e.g., a wafer) and a second substrate (e.g., an epitaxial chip) using pedestals. For example, alignment of a device layer (e.g., a quantum well layer) in the epitaxial chip can be aligned to one or more predefined waveguides in a silicon on insulator (SOI) wafer. A benefit of this approach is that the z-height registration is done by the pedestal, which may form a hard stop, instead of relying on bonding material (i.e., the pedestals are not the bonding material). Thus better accuracy can be achieved. Using pedestal hard stops can also allow for a variety of bonding materials to be used.

In some embodiments, a method of fabricating a composite semiconductor device is disclosed. A first semiconductor structure comprising a first material is provided. The first semiconductor structure has a recess with a first bottom a waveguide extending to a wall of the recess. The waveguide is at a first predetermined height above the first bottom surface. One or more pedestals extending to a second predetermined height in a direction normal to the first bottom surface is formed. A second semiconductor structure comprising a second material is provided. The second semiconductor structure has a second bottom surface and a device layer above the second bottom surface. The second semiconductor structure is placed in the recess of the first semiconductor structure. And the second bottom surface of the second semiconductor structure is bonded to the first bottom surface of the first semiconductor structure, wherein the second bottom surface of the second semiconductor structure contacts a top surface of the one or more pedestals such that the device layer of the second semiconductor structure is aligned with the waveguide of the first semiconductor structure. In some embodiments the first semiconductor structure is made of silicon and the second semiconductor structure is made of a III-V compound.

In some embodiments, a composite semiconductor device is disclosed. The composite semiconductor device comprises a first semiconductor structure and a second semiconductor structure. The first semiconductor structure comprises a first material (e.g., silicon) and has a recess with a first bottom surface. The first semiconductor structure also has a waveguide extending to a wall of the recess, wherein the waveguide is at a first predetermined height above the first bottom surface. One or more pedestals extending to a second predetermined height in a direction normal to the first bottom surface are formed in the recess. The second semiconductor structure comprises a second material (e.g., a III-V compound) and has a device layer and a second bottom surface below the device layer. The second bottom surface of the second semiconductor structure is bonded to the first bottom surface of the first semiconductor structure such that the second semiconductor structure is secured in the recess of the first semiconductor structure. Additionally, the second bottom surface of the second semiconductor structure contacts a top surface of the one or more pedestals such that the device layer of the second semiconductor device is aligned with the waveguide of the first semiconductor structure.

In some embodiments, a method for fabricating pedestals in a composite semiconductor device to align different types of chips is disclosed. A first semiconductor structure comprising a first material (e.g., silicon) is provided. The first semiconductor structure has a first recess with a first bottom surface. A first waveguide extends to a wall of the first recess. The first waveguide at a first predetermined height above the first bottom surface. The first semiconductor structure also has a base portion of one or more pedestals at a second predetermined height. A first thickness of a third material (e.g., a deposit material) on the base portion of the one or more pedestals of the first semiconductor structure, thus forming the pedestals. The one or more pedestals align a first chip with the first waveguide, and the first chip comprises a second material (e.g., III-V compound). A second structure comprising the first material is provided. The second structure has a second recess with a second bottom surface. A second waveguide extends to a wall of the second recess. The second waveguide is at the first predetermined height above the second bottom surface. The second structure has a base portion of one or more pedestals having the second predetermined height. A second thickness of the third material is placed on the base portion of the one or more pedestals of the second structure forming the pedestals of the second structure. The one or more pedestals of the second structure align a second chip with the second waveguide. The second chip comprises a fourth material (e.g., a III-V compound). In some embodiments, instead of the first recess and the second recess being in separate structures, the first recess and the second recess are in a common semiconductor structure.

Further areas of applicability of the present disclosure will become apparent from the detailed description provided hereinafter. It should be understood that the detailed description and specific examples, while indicating various embodiments, are intended for purposes of illustration only and are not intended to necessarily limit the scope of the disclosure.

BRIEF DESCRIPTION OF THE DRAWINGS

FIGS. 4A & 4B show a cross section view of a semiconductor structure having pedestals made from a deposit material.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF THE INVENTION

The ensuing description provides preferred exemplary embodiment(s) only, and is not intended to limit the scope, applicability, or configuration of the disclosure. Rather, the ensuing description of the preferred exemplary embodiment(s) will provide those skilled in the art with an enabling description for implementing a preferred exemplary embodiment. It is understood that various changes may be made in the function and arrangement of elements without departing from the spirit and scope as set forth in the appended claims.

Embodiments relate to bonding one substrate into a recess of another substrate, e.g. where the two substrates are different materials. For example, different material (e.g., III-V compounds) can be bonded on a silicon platform. Though making devices with silicon has some advantages (e.g., cost and developed fabrication methods), silicon is not a direct bandgap material. In certain applications it is desirable to have a direct bandgap material (e.g., for a laser gain medium), such as a III-V compound. When a first semiconductor structure (e.g., a substrate with a recess) is bonded to a second semiconductor structure (placed into the recess), there can be alignment issues during bonding such that an element of the first semiconductor structure is not properly aligned with an element of the second semiconductor structure. For example, the bonding material can have compliance such that there is variance in a final height of the second semiconductor structure relative to the first semiconductor structure. The alignment, as discussed below, is depicted as a vertical alignment. When one part (e.g., a device layer) of the second substrate is to be aligned with one part of the first substrate (e.g., a waveguide), then mismatches in height can cause problems (e.g., sub-optimal performance by not as effectively coupling light to and from the second semiconductor structure), and possibly device failure. In some embodiments, aligned refers to a desired relative position in the vertical dimension.

Figure 1A:
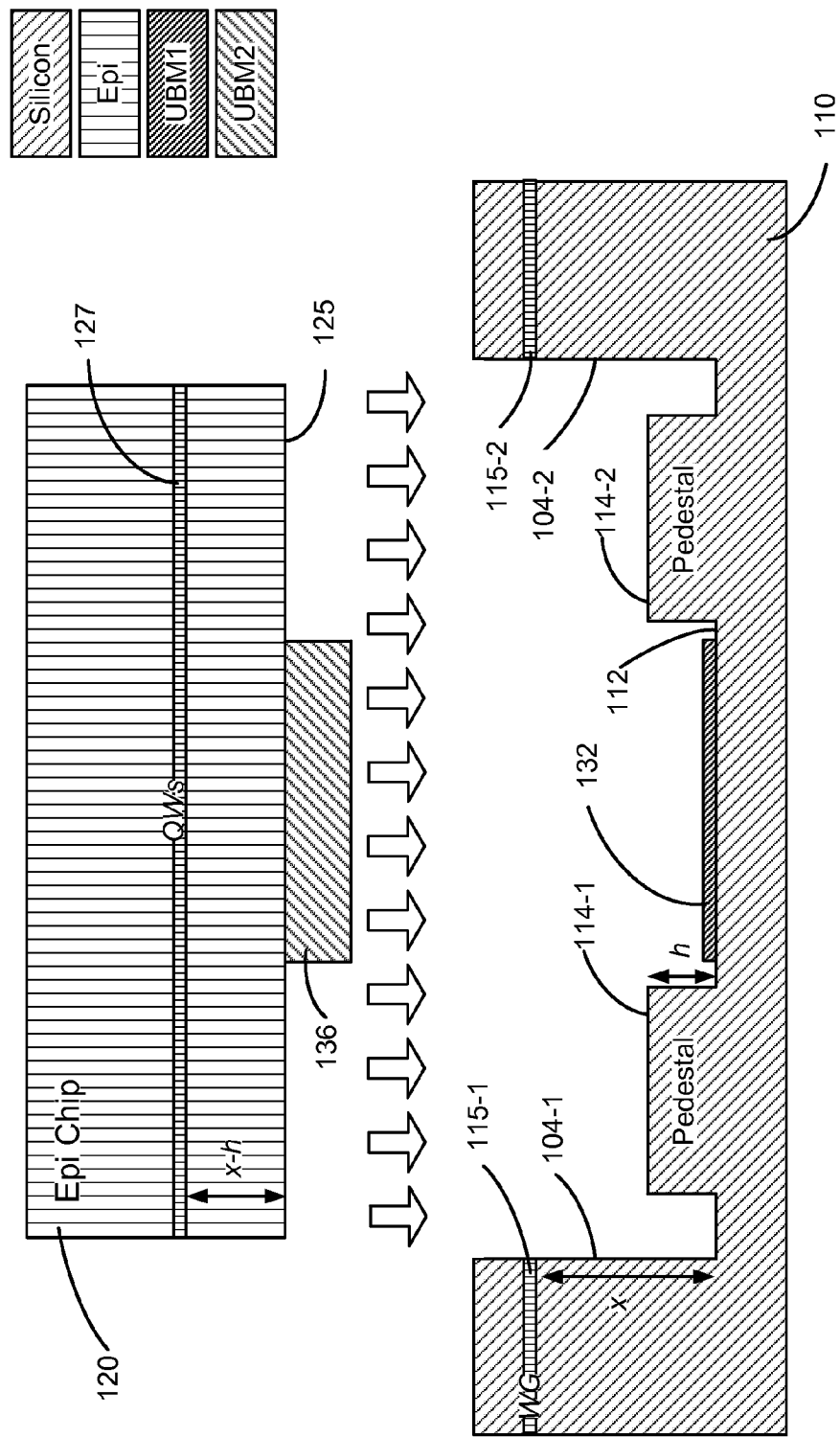
FIGS. 1A and 1B show a cross section view of a composite semiconductor device according to embodiments of the present invention.
Figure 1B:
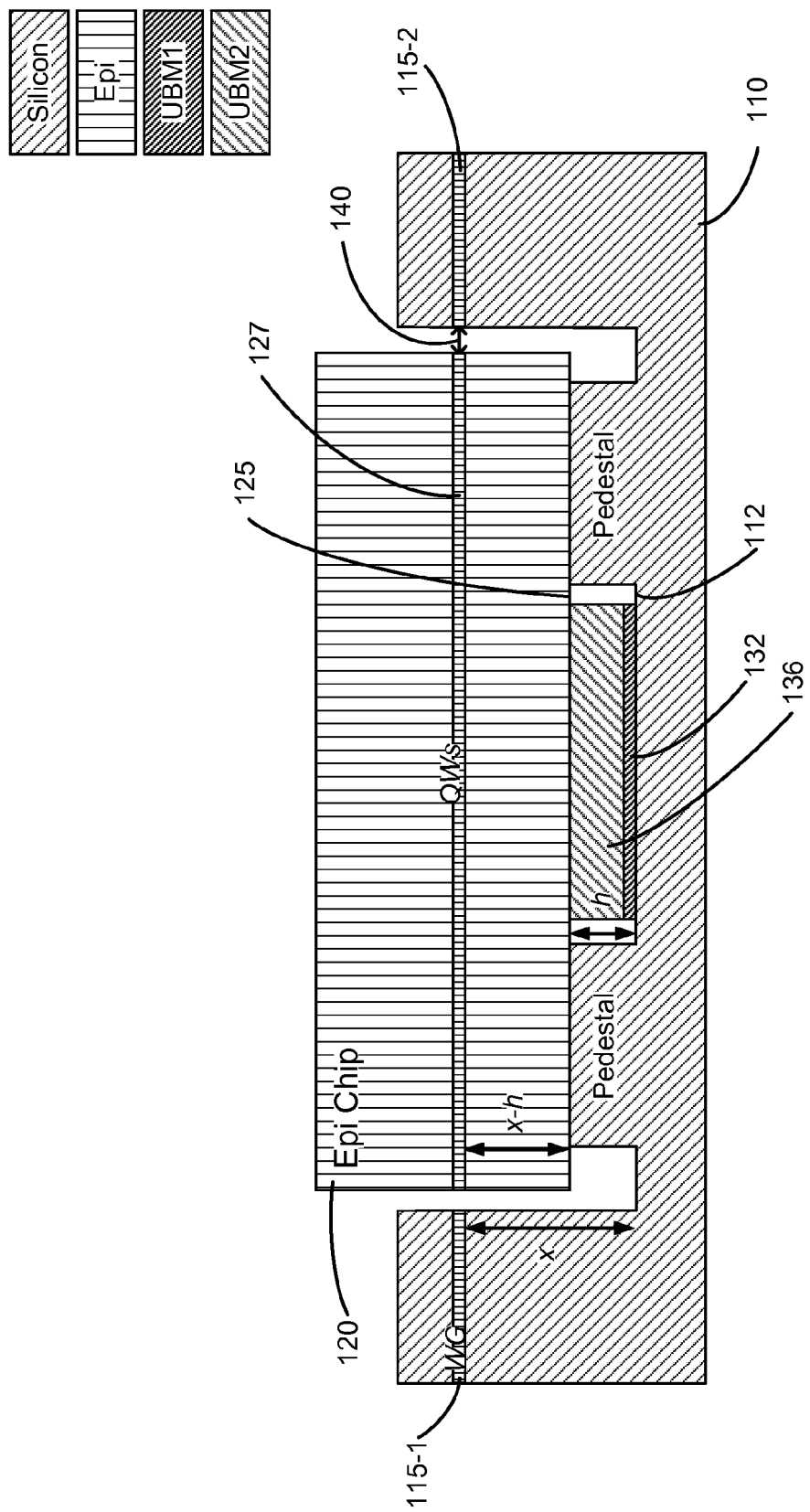

FIGS. 1A and 1B show a cross section view of a composite semiconductor device according to some embodiments of the present invention. In FIG. 1A, a silicon structure 110 (an example of the first semiconductor structure) is shown. The silicon structure 110 comprises a first wall 104-1, a second wall 104-2, and a first bottom surface 112. The first wall 104-1, the second wall 104-2, and the first bottom surface 112 form a recess in the silicon structure 110. Protruding from the first bottom surface 112 is a first pedestal and a second pedestal. Each pedestal has a top portion 114 that is a height h above the first bottom surface 112. The silicon structure 110 also comprises a first waveguide 115-1 and a second waveguide 115-2. The first waveguide 115-1 directs light horizontally through the first wall 104-1 into and/or out of the recess. The second waveguide guides light horizontally through the second wall 104-2 into and/or out of the recess. The first waveguide 115-1 and the second waveguide 115-2 are a height x above the first bottom surface 112. In some embodiments, the pedestals are of the same material as the first semiconductor structure. In some embodiments, the pedestals are made of a different material than the first semiconductor structure. In some embodiments, the pedestals are made of a combination of both the same material of the first semiconductor structure and different material (e.g., as described later in reference to FIG. 4B). In the description above, a silicon substrate was used as an example, but other materials can be used.

An Epi chip 120 (an example of the second semiconductor structure) is also shown. The Epi chip is an epitaxial structure to be bonded to the silicon structure 110 (FIG. 1A shows the Epi chip 120 and the silicon structure 110 before bonding occurs). In some embodiments, the Epi chip 120 includes one or more III-V materials having a device layer (e.g., a compound semiconductor used to create a laser medium, a detector, a modulator, etc.). Examples of the second semiconductor structure include a stack of III-V materials such as indium, gallium, and/or aluminum combined with phosphorus and/or arsenic, e.g., gallium arsenide or indium phosphide, as well as magneto-optic materials, e.g. for optical isolators.

In the embodiment shown, the Epi chip 120 includes a second bottom surface 125 and a device layer having a quantum well (QW) stack 127, which acts as a gain medium for a laser. The QW stack 127 is a height x–h above the second bottom surface 125. In some embodiments, the device layer may have one or more other elements in lieu of or in addition to the quantum wells. In some embodiments, the second semiconductor structure comprises a wave-guide layer, e.g. confinement of an optical wave. The optical wave could be confined to the device layer, e.g., QW stack 127, or other layer that may detect or modulate the optical wave. In the embodiment shown, the QW stack 127 of the Epi chip 120 is to be aligned with the first waveguide 115-1 and/or the second waveguide 115-2 of the silicon structure 110.

In some embodiments, a first under bump metallization (UBM) layer 132 and/or a second UBM layer 136 are used as bonding material to bond the Epi chip 120 to the silicon structure 110. The first UBM layer 132 (a first bonding material) and/or the second UBM layer 136 (a second bonding material) can comprise various metals. Examples include indium and palladium. One specific example is the alloy indium 7/palladium 3. Other examples of bonding materials are polymer, epoxy, and tin. In some embodiments, before the first semiconductor structure is bonded to the second semiconductor structure, a first bonding material is placed on the first semiconductor structure (e.g., the first UBM layer 132) and a second bonding material is placed on the second semiconductor structure (e.g., the second UBM layer 136). In some embodiments, the first bonding material is the same as the second bonding material. In some embodiments, bonding material is placed on the first semiconductor structure or the second semiconductor structure, but not both, before bonding. Typically, bonding material has some compliance, so without using pedestals there would likely be some variance in height of the Epi chip 120 in relation to the silicon structure 110 when bonded.

In some embodiments, the pedestals provide direct contact between a known location of the first semiconductor structure (e.g., silicon structure 110) and the second semiconductor structure (e.g. Epi Chip 120). As mentioned above, without having the pedestals there is some variance in height after bonding. But with the pedestals, the height after bonding can be controlled more accurately. Thus a purpose of the pedestals is to help with vertical alignment between the first semiconductor structure and the second semiconductor structure. This vertical alignment can be referred to as z-alignment, z being a direction perpendicular (i.e., normal) to the first silicon structure 110. This enables more accurate alignment in the z direction and also allows for a larger process window when bonding since the z-height is not set by the bonding process/material.

FIG. 1B shows the Epi chip 120 joined to the silicon structure 110. The Epi chip 120 and the silicon structure 110 are joined by the first UBM layer 132 and the second UBM layer 136. The first UBM layer 132 is attached to the first bottom surface 112 and the second UBM layer 136 is attached to the second bottom surface 125. Further, the first UBM layer 132 is joined to the second UBM layer 136. Thus the first bottom surface 112 is bonded to the second bottom surface 125.

Pedestals provide an alignment between the waveguides 115 and the QW stack 127. The bonding material may have compliance such that an initial thickness of the bonding material, i.e. including both the first bonding material (e.g., the first UBM layer 132) and the second bonding material bonding material (e.g., the second UBM layer 136) before joining the substrates is greater than h. In some embodiments, mechanical pressure exerted by the second semiconductor structure (e.g., Epi chip 120), which sits on the pedestals, forces the bonding material to the exact thickness needed (a thickness of h). Since a final height, h, between the first bottom surface 112 and the second bottom surface 125 is determined by the pedestals, there can be a wide tolerance for variations in the initial thickness of the bonding material. An initial thickness being larger than h can compensate for deposition non-uniformities, for porosities, and such, e.g., by having the bonding material fill in non-uniformities, thereby obtaining a better bond. The second semiconductor structure may be processed (e.g., pre-fabrication) or unprocessed (e.g., bare Epi material die).

After bonding the first semiconductor structure to the second semiconductor structure, the first semiconductor structure is aligned with the second semiconductor structure. For example, in the embodiment shown in FIG. 1B, the QW stack 127 of the Epi chip 120 is aligned with the waveguide 115 of the silicon structure 110 (both the QW stack 127 and the waveguide 115 being a height x above the first bottom surface 112. Thus light generated by the QW stack 127 is transmitted into the first waveguide 115-1 and/or the second waveguide 115-2. The waveguides 115 then direct the light to intended destination(s).

As shown, there is a horizontal gap 140 between the Epi chip 120 and the silicon structure 110. There are multiple ways to bridge the horizontal gap 140. One example for bridging the horizontal gap 140 is described in US Publication 2013/0051727, published Feb. 28, 2013, which is herein incorporated by reference.

In some embodiments, the second semiconductor structure comprises a wave-guiding layer that functions as a modulator (e.g. a hybrid optical modulator as described in U.S. patent application Ser. No. 13/861,564, filed on Apr. 12, 2013, which is herein incorporated by reference). The layers of the second semiconductor structure can define where the wave-guiding layer is going to be. In one implementation, a waveguide is made by a higher refractive index layer surrounded by one or more lower refractive index layers. A QW stack 127 is just one example of a wave-guiding layer used in the second semiconductor structure.

In another example, referring to FIG. 1B, light is transmitted from the left of the first waveguide 115-1, to the right of the first waveguide, and to the device layer of the Epi chip 120. But the device layer (e.g., the wave-guiding layer), instead of comprising a QW stack 127, comprises a modulator (e.g., one similar to a modulator described in the '564 application). Light is modulated as it passes through the Epi chip 120 and then transmitted to the second waveguide 115-2. In some embodiments, light from the first waveguide 115-1 and/or the second waveguide 115-2 could be absorbed in the device layer and converted into an electrical signal.

Figure 2A:
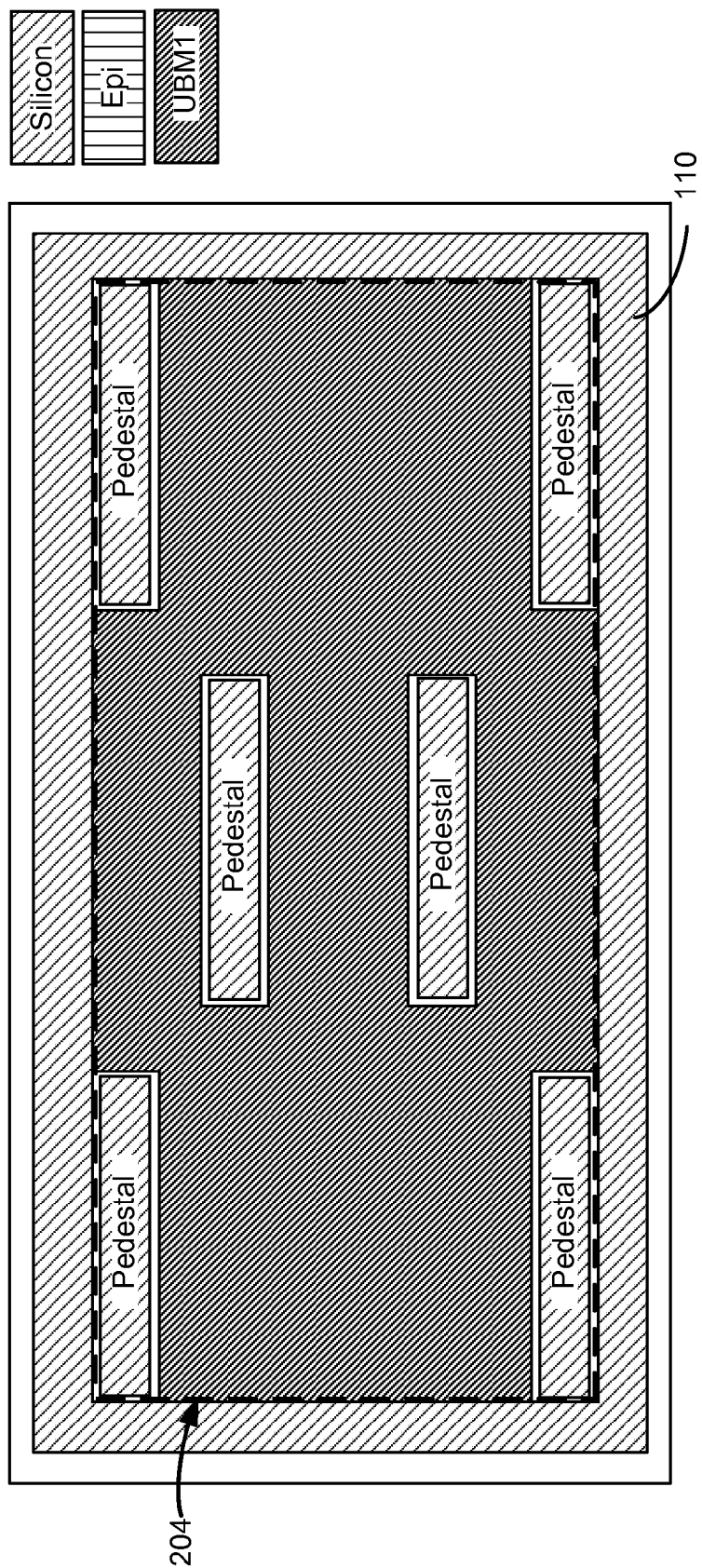
FIG. 2A shows a top down view of a semiconductor structure with a recess according to embodiments of the present invention before bonding a second semiconductor structure in the recess.
Figure 2B:
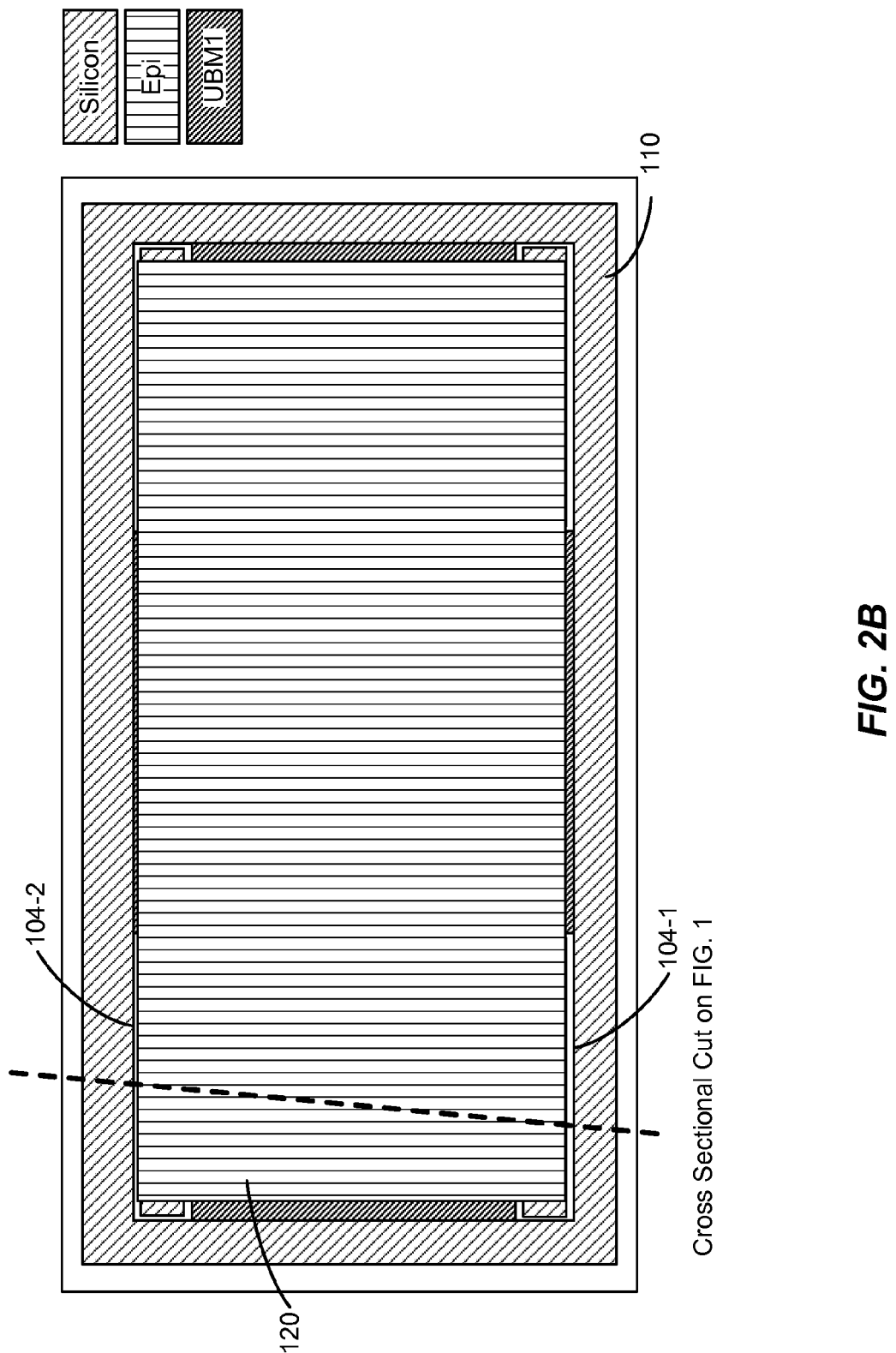
FIG. 2B shows a top down view of a first semiconductor structure with a recess according to embodiments of the present invention after bonding a second semiconductor structure in the recess.

Referring next to FIGS. 2A and 2B, FIG. 2A shows a top down view of the silicon structure 110 with a recess 204 according to embodiments of the present invention before bonding the Epi chip 120 in the recess 204. Also shown in FIG. 2A are a plurality of pedestals. In FIG. 2A, pedestals cover only certain regions of the first bottom surface 112. The pedestals are placed in a configuration to provide mechanical support and space for bonding the first bottom surface 112 to the second bottom surface 125. In this embodiment, the pedestals are rectangular. But the pedestals can have nearly any shape, be of nearly any size, and be located nearly anywhere under the Epi chip 120. Shape, size, number, and location of the pedestals can be determined based on a type, size, and/or function of a device being made and/or process being used. For example, instead of a multiple number of pedestals, a single pedestal forming a four-sided, bench-type structure around the edge of the recess 204 could be used; or one or more pedestals having one or more smaller recesses could be used.

FIG. 2B shows a top down view of a silicon structure 110 according to embodiments of the present invention after bonding with the Epi chip 120. The Epi chip 120 rests on the pedestals in the recess 204. The pedestals provide mechanical support for the Epi chip 120. In FIG. 2B, a dashed line is shown representing a cross-sectional cut depicted in FIG. 1B. In some embodiments, the waveguides 115 are at an angle to the Epi chip 120 to minimize back reflections into the waveguide 115. In some embodiments, the waveguides 115 of the silicon structure 110 can effectively be a plane. In some embodiments, there are multiple waveguides with the multiple waveguides being at a common height. Waveguides (e.g., waveguides 115) can have different cross-sections, e.g. rectangular or rib waveguides. The waveguides 115 in the silicon structure 110 can be defined before or after the second semiconductor structure (e.g., Epi chip 120) is bonded to the first substrate. In some embodiments, multiple waveguides can be created within a waveguide layer of the first semiconductor structure. The device layer of the second semiconductor structure can also have multiple channels (which may also be called waveguides) formed before or after bonding to align with waveguides 115 of the first semiconductor structure. Photolithography can be used to perform alignment of waveguides in lateral (i.e., horizontal) directions.

It is to be understood that in many embodiments the silicon structure 110 extends horizontally further than depicted in FIGS. 1A, 1B, 2A, and 2B. For example, in some embodiments the silicon structure 110 comprises one or more Silicon Photonics devices (e.g., binary superimposed grating(s), coupler(s), diode(s), and/or heater(s)).

Figure 3:
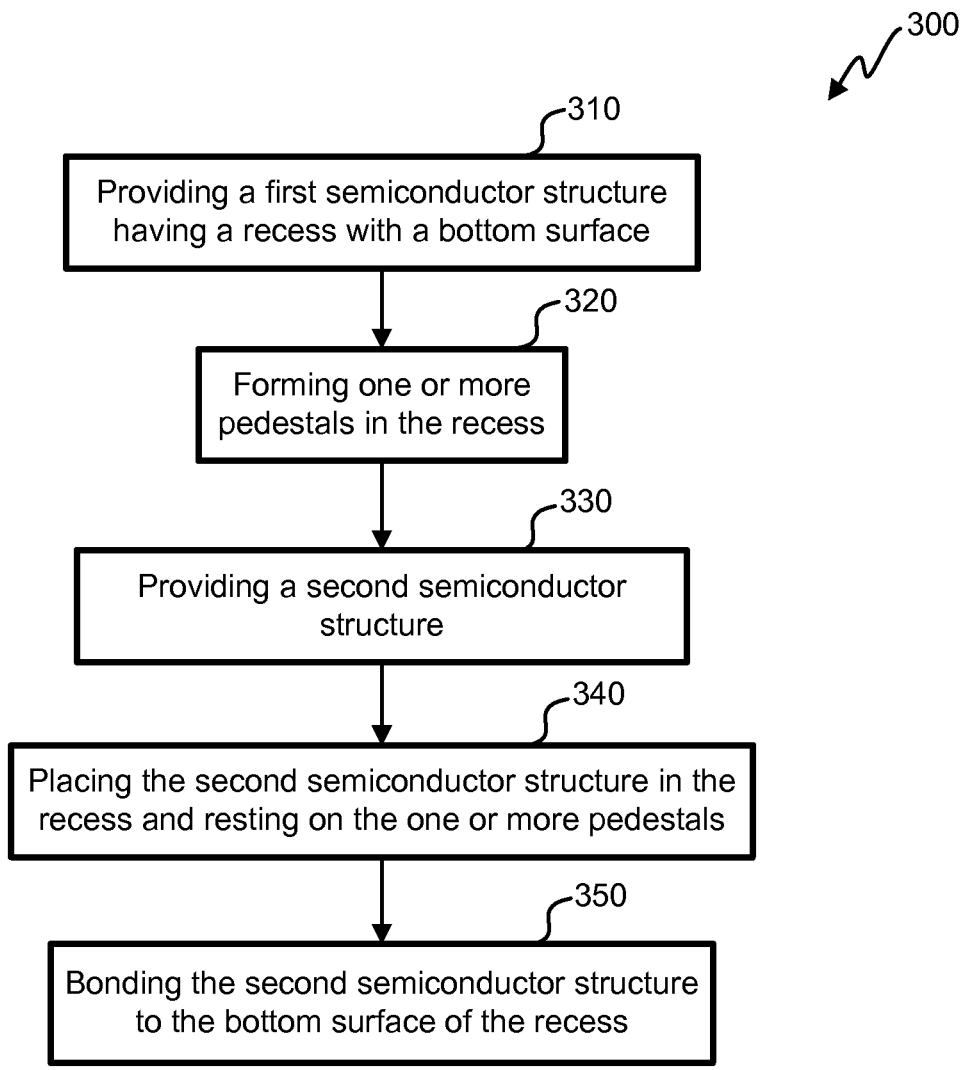
FIG. 3 shows a flowchart for an embodiment of a process for fabricating a composite semiconductor device.

FIG. 3 shows a flowchart of an embodiment for fabricating a composite semiconductor device. In step 310, a first semiconductor structure comprising a first material (e.g., the silicon structure 110 in FIGS. 1A and 1B) is provided. The first semiconductor structure has a recess (e.g., 204) with a first bottom surface (e.g., 112). The first semiconductor structure has a waveguide (e.g., waveguide 115) extending to an inner wall (e.g., 104) of the recess. The waveguide is at a first predetermined height (e.g., x in FIGS. 1A and 1B) above the first bottom surface.

In step 320, a plurality of pedestals extending to a second predetermined height in a direction normal to the first bottom surface is formed. In FIGS. 1A and 1B, the pedestals extend to a height h. In some embodiments, pedestals are patterned prior to bonding a second semiconductor structure (e.g., the Epi chip 120 made of a III-V compound) with a predetermined etch depth. This etch depth is based on a required height to align the first semiconductor structure with the second semiconductor structure, e.g. to align the QW stack 127 to waveguides 115 in FIG. 1B. The pedestals can have various shapes, sizes, and are located underneath the second semiconductor structure.

In some embodiments, the pedestals are etched into the first semiconductor structure. A top surface of the pedestal can be determined by an interface between two known materials. For example, the top surface of the pedestal could be an interface between the silicon and silicon dioxide in a silicon on insulator wafer. In that case, it is relatively easy to etch because there is a natural etch stop; thus the height of the pedestal can be fixed to a very high accuracy.

In some implementations, before step 320 the first semiconductor structure could have a silicon device layer, then a buried oxide, and then a silicon substrate. The pedestal could be created by etching the silicon device layer and then etching the oxide, and stopping at an interface between the oxide and the silicon substrate. The pedestals could also be made of a different material, e.g. silicon dioxide as opposed to being made of the silicon substrate.

In step 330, a second semiconductor structure (e.g., Epi chip 120) is provided. The second semiconductor structure has a second bottom surface (e.g. surface 125) and a device layer (e.g., QW stack 127) above the second bottom surface 125. In various embodiments, the device layer can be a layer that generates light, transmits light, detects light, and/or modulates light.

In step 340, the second semiconductor structure is placed in the recess. This step is shown in FIGS. 1B and 2B wherein the Epi chip 120 is shown within the recess 204. A bonding material can be deposited on the surface of either or both of the first semiconductor structure and second semiconductor structure.

In step 350, the second semiconductor structure is joined to the first substrate using bonding material attached to the first bottom surface. In some embodiments, the bonding material can be deposited on the first semiconductor structure and thus attached to the first semiconductor structure. In some embodiments, the bonding material can be deposited on the second semiconductor structure before joining, thereby attaching the bonding material to the second semiconductor structure. The bonding material may be around just part of a pedestal or around all of the pedestal. In the embodiment in FIG. 1, bonding material is added (e.g. pre-deposited before step 340) to the first bottom surface 112 of the first semiconductor structure and to the second bottom surface 125 of the second semiconductor structure.

The second bottom surface (e.g., 125) of the second semiconductor structure contacts a top surface (e.g., top surface 114) of the plurality of pedestals such that the device layer of the second semiconductor structure is aligned with the waveguides 115 of the first semiconductor structure. For example, the Epi chip 120 sits directly on the pedestals to ensure a z-height (vertical) alignment. In one aspect, alignment accuracy is based on processing accuracy (e.g., CMOS processing accuracy). Material interfaces can be used to define pedestal height for additional accuracy improvements, e.g. the top of the pedestal can be the top of the BOX (buried oxide) in an SOI wafer.

Referring next to FIGS. 4A & 4B, a cross section view of embodiments of a semiconductor structure having pedestals formed by deposition (e.g., epitaxial growth) are shown. In FIG. 4A a recess is formed by etching a silicon structure 410 without leaving any pedestals. The silicon structure 410 is otherwise similar to the silicon structure 110 in FIG. 1. Pedestals in FIG. 4A are grown using a deposit material. In some embodiments, the deposit material is a dielectric; for example silicon nitride ($Si_3N_4$). In some embodiments the deposit material is a polymer. In some embodiments, the deposit material is a semiconductor (e.g., silicon).

In FIG. 4B, a base portion 424 of pedestals are left after etching a silicon structure 420. The base portion 424 has a height b. On top of the base portion 424, a delta portion 428 comprising deposit material is added. The delta portion 428 has a height of d. The height of the pedestal h is determined by the height b of the base portion 424 plus the height d of the delta portion 428 (i.e., b+d=h). In some embodiments, the base portion 424 has a height b determined by an interface in the silicon structure 420 (e.g., an interface between an oxide layer and a substrate). In some embodiments, the height b of the base portion 424 is set so the pedestals can accommodate multiple different types of second semiconductor structures by having different delta portion 428 heights d for the different types of second semiconductor structures. In some embodiments, having the base portion 424 of the pedestal saves time and resources in growing the rest of the pedestal (i.e., the delta portion 428).

Figure 5A:
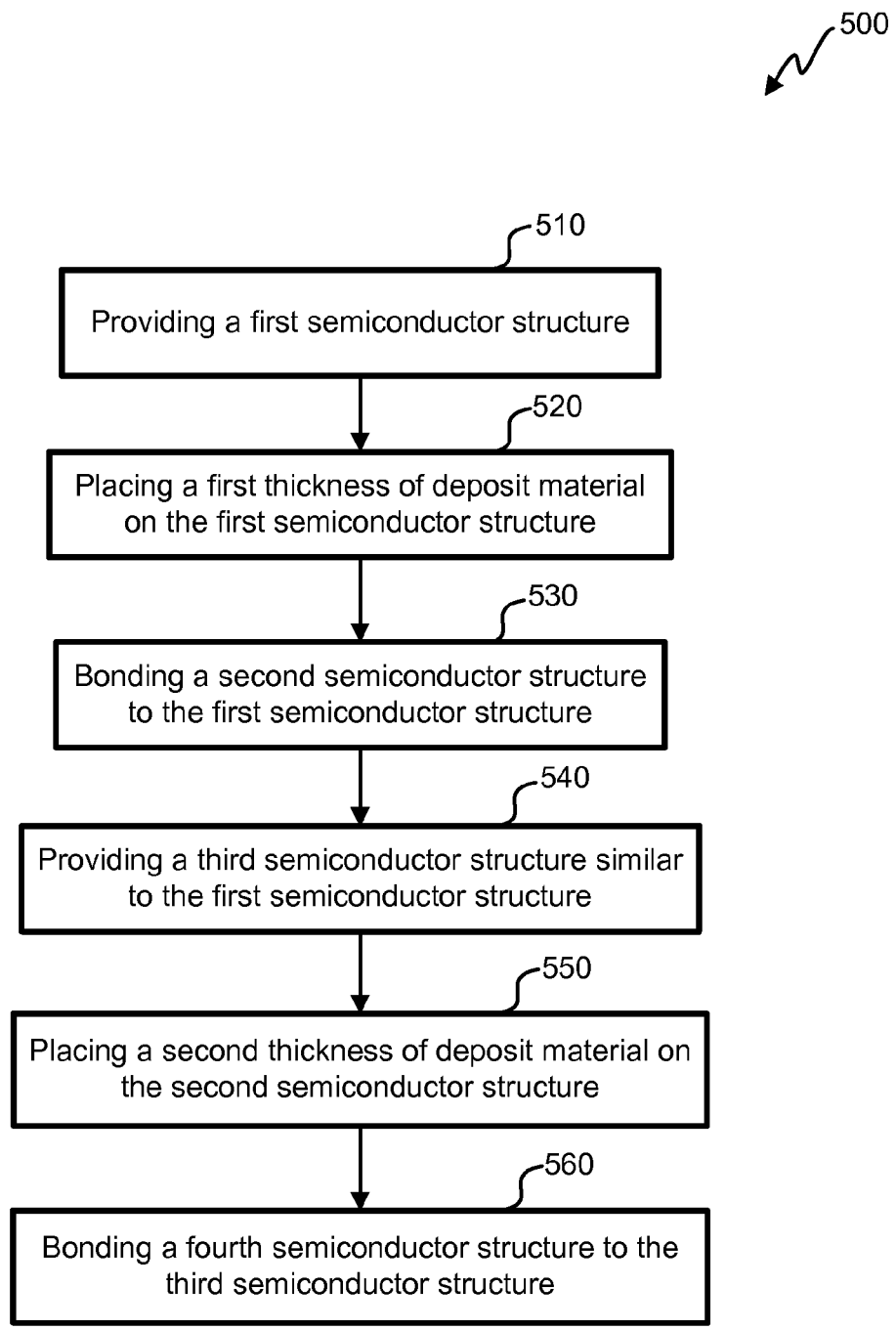
FIG. 5A shows a flowchart for an embodiment of a process for changing pedestal height for integrating with different chips.
Figure 5B:
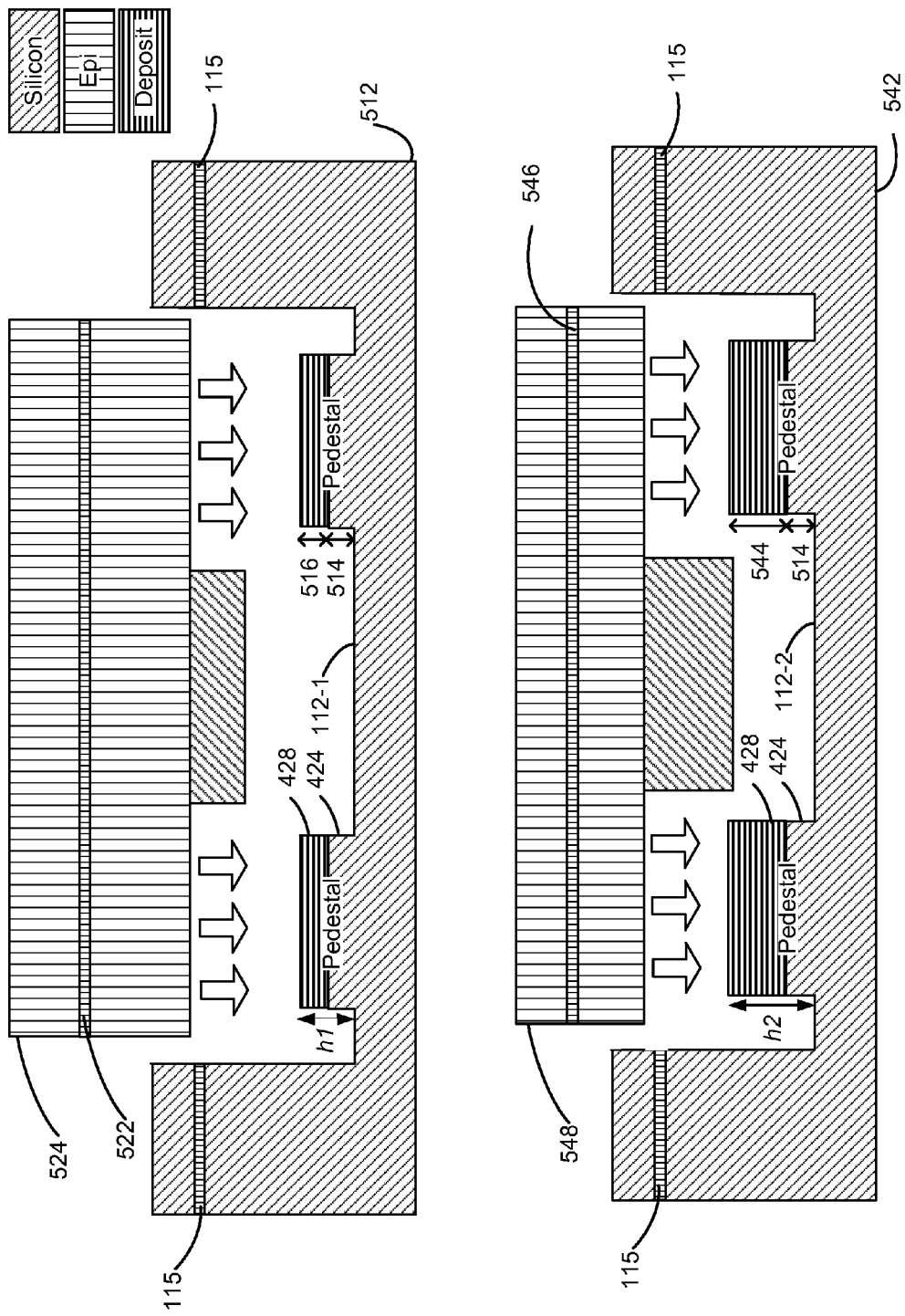
FIG. 5B shows cross sections of an embodiment of semiconductor structures bonding according to the process for changing pedestal height for integrating with different chips.

Referring next to FIG. 5A, a flowchart for an embodiment of a process 500 for forming pedestal heights to accommodate different structures is shown. FIG. 5B shows cross sections of an embodiment of semiconductor structures bonding according to the process 500 for changing pedestal height for integrating with different chips. The process 500 begins in step 510 where a first semiconductor structure 512 (e.g., silicon structure 410 or 420) is provided. The first semiconductor structure 512 has a base portion (e.g., 424) of a pedestal having a predetermined height 514. In some embodiments, the predetermined height 514 is zero (i.e., b=0). A first thickness 516 of deposit material is placed on the pedestals of the first semiconductor structure 512 to form a pedestal having a first height, h1, step 520. The first height h1 is for aligning an optical element 522 (e.g., QW stack 127) of a second semiconductor structure 524 (e.g., Epi chip 120) with an optical element (e.g., waveguide 115) of the first semiconductor structure 512 (e.g., silicon structure 420). In some embodiments, additional material is not needed to align the optical element 522 of the second semiconductor structure 524 with the optical element of the first semiconductor structure 512 (e.g., d=0 and h=b in FIG. 4B) and the process 500 flows from step 510 to 530. In step 530, the first semiconductor structure 512 is bonded to the second semiconductor structure 524 (e.g., similar to step 350 in FIG. 3).

In step 540, a third semiconductor structure 542 is provided. The third semiconductor structure 542 is similar to the first semiconductor structure 512. In some embodiments, the third semiconductor structure 542 is identical to the first semiconductor structure 512. The third semiconductor structure 542 has a base portion of pedestals having the predetermined height 514 (i.e., the base portion height of the third semiconductor structure 542 is equal to the base portion height of the first semiconductor structure 512). A second thickness 544 of deposit material is placed on the pedestals of the third semiconductor structure 542 causing the pedestals to have a second height h2, step 550. In some embodiments, the second height h2 is not equal to the first height h1. The second height h2 is for aligning an optical element 546 (e.g., a modulator) of a fourth semiconductor structure 548 (e.g., a III-V compound) with an optical element (e.g., waveguide 115) of the third semiconductor structure 542. The fourth semiconductor structure 548 is then bonded to the third semiconductor structure 542, step 560. Thus one silicon structure (e.g., silicon structure 430) can be manufactured and used with many different types of III-V chips.

In some embodiments, a silicon structure could have multiple recesses to integrate multiple chips on one substrate. For example, a silicon platform is formed comprising three layers: a substrate layer made of silicon, an oxide layer comprising silicon on top of the substrate layer, and a device layer made of silicon on top of the oxide layer. A first recess and a second recess are formed in the silicon platform by etching portions of the silicon platform to an interface between the oxide layer and the substrate layer. In the first recess and the second recess, the interface between the oxide layer and the substrate layer forms a top layer for base portions of pedestals. Without further etching the top layer for base portions of the pedestals, the first recess and the second recess are further etched down to a first bottom surface (where the first bottom surface is in the substrate layer and below the interface between the oxide layer and the substrate layer). A first chip is bonded in the first recess. The first chip is made of a III-V compound and is used as a gain medium for a laser. The first chip is bonded in the first recess without adding a deposit material on top of the base portion of pedestals in the first recess. A second chip is bonded in the second recess. The second chip is a modulator made of a III-V compound material. The second chip has a device layer at a different height than the first chip. Deposit material is added to the base portions of pedestals in the second recess before the second chip is bonded in the second recess. Thus both the first chip and the second chip are at a desired vertical position in relation to the silicon platform even though both the first chip and the second chip have different dimensions. In some embodiments, etching is used to remove material from the base portions of pedestals to align a chip within a recess. For example, a first recess comprises pedestals at a first height and a second recess comprises pedestals also at the first height. Then the pedestals in the second recess are etched further. Thus adding material and/or removing material can be used to adjust pedestal heights to align (e.g. in the z dimension) chips within recesses.

Thus a single silicon platform can be etched to have multiple recesses (e.g., 2, 3, 4, 5, 6, 10, or more recesses); where each of the multiple recesses is etched to a common depth. Different thicknesses of deposit material is added as appropriate to each of the multiple recesses depending on what chip is to be bonded in each of the multiple recesses.

The specific details of particular embodiments may be combined in any suitable manner without departing from the spirit and scope of embodiments of the invention. However, other embodiments of the invention may be directed to specific embodiments relating to each individual aspect, or specific combinations of these individual aspects.

The above description of exemplary embodiments of the invention has been presented for the purposes of illustration and description. It is not intended to be exhaustive or to limit the invention to the precise form described, and many modifications and variations are possible in light of the teaching above. For example, similar techniques as described above could be used in aligning the second semiconductor structure relative to the first semiconductor structure in the z direction in order to align an electrical contact (e.g., for a high speed III-V circuit element) and/or to form a planar top surface across both the first semiconductor structure and the second semiconductor structure.

The embodiments were chosen and described in order to explain the principles of the invention and practical applications to thereby enable others skilled in the art to best utilize the invention in various embodiments and with various modifications as are suited to the particular use contemplated.

Also, it is noted that the embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional steps not included in the figure. A process may correspond to a method, a function, a procedure, a subroutine, a subprogram, etc.

A recitation of "a", "an" or "the" is intended to mean "one or more" unless specifically indicated to the contrary.

All patents, patent applications, publications, and descriptions mentioned here are incorporated by reference in their entirety for all purposes. None is admitted to be prior art.

What is claimed is:

1. A method of fabricating a composite semiconductor device, the method comprising:
   providing a first semiconductor structure comprising a first material, wherein the first material is silicon, and having:
      a first surface in a first recess;
      a first waveguide extending to a wall of the first recess, the first waveguide at a first predetermined height above the first surface;
      a third surface in a second recess; and
      a second waveguide extending to a wall of the second recess, the second waveguide at the first predetermined height above the third surface;
   forming a base portion of a pedestal in the first recess extending to a second predetermined height in a direction normal to the first surface;
   forming a base portion of a pedestal in the second recess extending to the second predetermined height in a direction normal to the third surface;
   providing a second semiconductor structure comprising a second material, wherein the second material is a III-V compound, and having:
      a second surface; and
      a device layer above the second surface;
   providing a third semiconductor structure comprising a fourth material, wherein the fourth material is a III-V compound, and having:
      a fourth surface; and
      a device layer above the fourth surface;
   placing a first thickness of a third material on the base portion of the pedestal in the first recess;
   placing a second thickness of the third material on the base portion of the pedestal in the second recess;
   placing the second semiconductor structure in the first recess of the first semiconductor structure;
   bonding the second surface of the second semiconductor structure to the first surface of the first semiconductor structure, wherein the second surface of the second semiconductor structure contacts a top surface of the pedestal in the first recess such that the device layer of the second semiconductor structure is aligned with the first waveguide of the first semiconductor structure;
placing the third semiconductor structure in the second recess of the first semiconductor structure; and
bonding the fourth surface of the third semiconductor structure to the third surface of the first semiconductor structure, wherein the fourth surface of the third semiconductor structure contacts a top surface of the pedestal in the second recess such that the device layer of the third semiconductor structure is aligned with the second waveguide of the first semiconductor structure.

2. The method of claim 1, wherein:
the pedestal in the first recess has a height h above the first surface;
the first waveguide has a height x above the first surface; and
the device layer of the second semiconductor device has a height x−h above the second surface.

3. The method of claim 1, further comprising:
depositing a bonding material on the first surface around the pedestal in the first recess before joining the first semiconductor structure and the second semiconductor structure.

4. The method of claim 1, further comprising depositing a bonding material on the second surface before joining the first semiconductor structure and the second semiconductor structure.

5. The method of claim 1, wherein the base portion of the pedestal in the first recess is formed from the first material.

6. The method of claim 1, wherein bonding the second surface of the second semiconductor structure to the first surface of the first semiconductor structure uses a bonding material comprising a metal.

7. The method of claim 1, wherein the base portion of the pedestal in the first recess is formed by etching the first semiconductor structure.

8. The method of claim 7, wherein a top of the base portion of the pedestal in the first recess is defined by etching to a location of an interface between the first material and another material.

9. A composite semiconductor device, the device comprising:
a first semiconductor structure comprising a first material, wherein the first material is silicon, and having:
a first surface in a first recess;
a first waveguide extending to a wall of the first recess, wherein the first waveguide is at a first predetermined height above the first surface;
a base portion of a pedestal in the first recess extending to a second predetermined height in a direction normal to the first surface; and
a first thickness of a third material on the base portion of the pedestal in the first recess;
a second semiconductor structure comprising a second material, wherein the second material is a III-V compound, and having:
a device layer; and
a second surface below the device layer, wherein:
the second surface of the second semiconductor structure is bonded to the first surface of the first semiconductor structure such that the second semiconductor structure is secured in the first recess of the first semiconductor structure; and
the second surface of the second semiconductor structure contacts a top surface of the pedestal in the first recess such that the device layer of the second semiconductor device is aligned with the first waveguide of the first semiconductor structure;
a third semiconductor structure comprising the first material and having:
a third surface in a second recess;
a second waveguide extending to a wall of the second recess, the second waveguide at the first predetermined height above the third surface;
a base portion of the pedestal in the second recess extending to the second predetermined height in a direction normal to the third surface; and
a second thickness of the third material on the base portion of the pedestal in the second recess; and
a fourth semiconductor structure comprising the second material and having:
a device layer; and
a fourth surface below the device layer, wherein:
the fourth surface of the fourth semiconductor structure is bonded to the third surface of the third semiconductor structure such that the fourth semiconductor structure is secured in the second recess of the third semiconductor structure; and
the fourth surface of the fourth semiconductor structure contacts a top surface of the pedestal in the second recess such that the device layer of the fourth semiconductor device is aligned with the second waveguide of the third semiconductor structure.

10. The composite semiconductor device of claim 9, wherein the first recess with the first surface was formed by etching the first semiconductor structure.

11. The composite semiconductor device of claim 9, wherein:
the pedestal of the first recess has a height h above the first surface;
the first waveguide has a height x above the first surface; and
the device layer of the second semiconductor device has a height x−h above the second surface.

12. The composite semiconductor device of claim 9, wherein there are at least five pedestals in the first recess.

13. A method of fabricating pedestals for a composite semiconductor structure, the method comprising:
providing a first semiconductor structure comprising a first material and having:
a first recess with a first bottom surface;
a first waveguide extending to a wall of the first recess, the first waveguide at a first predetermined height above the first bottom surface; and
a base portion of a first pedestal having a second predetermined height;
placing a first thickness of a third material on the base portion of the first pedestal of the first semiconductor structure to form the first pedestal, wherein:
the first pedestal aligns a first chip with the first waveguide; and
the first chip comprises a second material;
providing a second semiconductor structure comprising the first material and having:
a second recess with a second bottom surface;
a second waveguide extending to a wall of the second recess, the second waveguide at the first predetermined height above the second bottom surface; and
a base portion of a second pedestal having the second predetermined height; and placing a second thickness of the third material on the base portion of the second pedestal forming the second pedestal, wherein:
the second pedestal of the second semiconductor structure aligns a second chip with the second waveguide; and
the second chip comprises a fourth material.

14. The method of claim 13, wherein the fourth material is the same as the second material.

15. The method of claim 13, wherein the first material is silicon and the second material is a III-V compound.

16. The method of claim 13, further comprising depositing a bonding material on the first bottom surface around the first pedestal of the first semiconductor structure before joining the first semiconductor structure and the first chip.

* * * * *